(12) United States Patent
Miyata et al.

(10) Patent No.: US 7,436,063 B2
(45) Date of Patent: Oct. 14, 2008

(54) PACKAGING SUBSTRATE AND SEMICONDUCTOR DEVICE

(75) Inventors: Osamu Miyata, Kyoto (JP); Shingo Higuchi, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 94 days.

(21) Appl. No.: 11/242,125

(22) Filed: Oct. 4, 2005

(65) Prior Publication Data
US 2006/0071333 A1    Apr. 6, 2006

(30) Foreign Application Priority Data
Oct. 4, 2004    (JP) ............................... 2004-291731

(51) Int. Cl.
*H01L 23/48* (2006.01)

(52) U.S. Cl. ....................... 257/738; 174/255; 257/737; 257/738; 257/778; 257/779; 257/780; 257/E23.01; 361/767; 361/768

(58) Field of Classification Search ................. 174/255; 361/767, 768; 257/737, 738, 780, 778, 779, 257/E23.01
See application file for complete search history.

(56) References Cited

U.S. PATENT DOCUMENTS

| | | | | |
|---|---|---|---|---|
| 5,519,580 A | * | 5/1996 | Natarajan et al. ........... | 361/760 |
| 6,028,366 A | * | 2/2000 | Abe ............................ | 257/779 |
| 6,201,305 B1 | * | 3/2001 | Darveaux et al. ........... | 257/779 |
| 6,472,608 B2 | * | 10/2002 | Nakayama ................... | 174/255 |
| 6,580,174 B2 | * | 6/2003 | McCormick et al. ........ | 257/774 |
| 6,787,443 B1 | * | 9/2004 | Boggs et al. ................ | 438/612 |
| 7,005,750 B2 | * | 2/2006 | Liu ............................. | 257/779 |

FOREIGN PATENT DOCUMENTS

JP        05-047998        2/1993

* cited by examiner

*Primary Examiner*—Eugene Lee
*Assistant Examiner*—Peniel M Gumedzoe
(74) *Attorney, Agent, or Firm*—Rabin & Berdo, PC

(57) ABSTRACT

A packaging substrate according to the present invention is a packaging substrate to which a semiconductor chip having a plurality of connection metal bodies on a surface thereof is bonded with the surface opposed to the packaging substrate and comprises a wiring provided on a bonding surface to which the semiconductor chip is bonded, a plurality of electrode parts provided on the bonding surface and electrically connected to the wiring, a wiring protective layer for coating and protecting the wiring, electrode openings formed by partly opening the wiring protective layer for separately exposing each of the electrode parts from the wiring protective layer, and escape openings each formed in continuation with each of the electrode openings in the wiring protective layer for introducing therein a part of the connection metal body to be connected to each of the electrode parts to escape.

6 Claims, 2 Drawing Sheets

PACKAGING SUBSTRATE AND SEMICONDUCTOR DEVICE

BACKGROUND OF THE INVENTION

1. Field of the Invention

The present invention relates to a packaging substrate to which a semiconductor chip is packaged, and a semiconductor device obtained by packaging a semiconductor chip to the packaging substrate.

2. Description of Related Art

Semiconductor devices of a flip chip bonding structure are hitherto known in which a semiconductor chip is bonded to a surface of a packaging substrate such as a printed wiring substrate in a face down manner.

In a semiconductor chip to be applied to such a semiconductor device of a flip chip bonding structure, a function surface thereof on which a function element is formed is coated with a passivation film. The passivation film is provided with a plurality of openings for partly exposing an internal wiring electrically connected to the function element as electrode pads. On each of the electrode pads, a metal ball of a fusible metal material such as solder is formed in a protruded manner. On the other hand, a surface of the packaging substrate is coated with a solder resist layer for protecting a wiring. The solder resist layer is provided with openings for partly exposing the wiring at the positions respectively corresponding to the electrode pads of the semiconductor chip.

Thus, the semiconductor chip is bonded to the surface of the packaging substrate with the function surface of the semiconductor chip opposed to the surface of the packaging substrate. Each metal ball is connected through the corresponding opening to the wiring on the packaging substrate, so that the semiconductor chip and the packaging substrate are connected with a predetermined distance therebetween and electrically connected to each other. Thereby, a semiconductor device of a flip chip bonding structure can be obtained.

However, the sizes (volumes) of the metal balls are not always strictly uniform with one another but somewhat different. Therefore, in a semiconductor device of a flip chip bonding structure, sometimes there occurs a problem that a semiconductor chip 102 is bonded to a packaging substrate 101 in an inclined manner as shown in FIG. 4. Especially in an ultra small semiconductor device to which a WL-CSP (Wafer Level-Chip Scale Package) technology has been applied, such a problem caused by the difference between the sizes of metal balls 103 remarkably appears.

SUMMARY OF THE INVENTION

Therefore, an object of the present invention is to provide a semiconductor device in which a semiconductor chip is bonded in a parallel position to a packaging substrate, and a packaging substrate with which such a semiconductor device can be obtained.

A packaging substrate according to the present invention is a packaging substrate to which a semiconductor chip having a plurality of connection metal bodies on a surface thereof is bonded with the surface opposed to the packaging substrate, and comprises a wiring provided on a bonding surface thereof to which the semiconductor chip is bonded, a plurality of electrode parts provided on the bonding surface and electrically connected to the wiring, a wiring protective layer for coating and protecting the wiring, electrode openings formed by partly opening the wiring protective layer for separately exposing each of the electrode parts from the wiring protective layer, and escape openings each formed in continuation with each of the electrode openings in the wiring protective layer for introducing therein a part of the connection metal body to be connected to each of the electrode parts to escape.

According to this arrangement, even if the sizes of the connection metal bodies of the semiconductor chip are different from one another, a part of each of relatively large-sized connection metal bodies can escape into the escape opening when the semiconductor chip is bonded to the packaging substrate and each connection metal body is connected to each electrode part, so that the distance between the semiconductor chip and the packaging substrate can be uniformalized with the distance corresponding to a relatively small-sized (the smallest-sized) connection metal body. As a result, a parallel position of the semiconductor chip to the packaging substrate can be ensured, thereby to obtain a semiconductor device in which the semiconductor chip is bonded in a parallel position to the packaging substrate.

Further, a semiconductor device according to the present invention comprises a packaging substrate and a semiconductor chip which has a plurality of connection metal bodies on a surface thereof and is bonded to the packaging substrate with the surface opposed to the packaging substrate, and the packaging substrate comprises a wiring provided on a bonding surface thereof to which the semiconductor chip is bonded, a plurality of electrode parts provided on the bonding surface and electrically connected to the wiring, a wiring protective layer for coating and protecting the wiring, electrode openings formed by partly opening the wiring protective layer for separately exposing each of the electrode parts from the wiring protective layer, and escape openings each formed in continuation with each of the electrode openings in the wiring protective layer for introducing therein a part of the connection metal body to be connected to each of the electrode parts to escape.

In other words, a semiconductor device according to the present invention comprises such a packaging substrate as abovementioned and a semiconductor chip which has a plurality of connection metal bodies on a surface thereof and is bonded to the packaging substrate with the surface opposed to the packaging substrate. Therefore, a semiconductor device in which a semiconductor chip is bonded in a parallel position to a packaging substrate can be obtained.

It is preferable that the escape opening is formed along the wiring extended from the electrode opening formed in continuation with the escape opening. With this arrangement, since the escape opening is formed along the wiring, the connection metal body can be led along the wiring (a molten solution of the connection metal body can be led along the wiring) into the escape opening when the connection metal body is connected to the electrode part. Therefore, with the use of this packaging substrate, a semiconductor device in which a semiconductor chip is bonded in a parallel position to the packaging substrate can be more surely obtained.

The abovementioned and other objects, features and advantages of the present invention will become more apparent from the following description of preferred embodiments given with reference to the appended drawings.

DETAILED DESCRIPTION OF PREFERRED EMBODIMENTS

Figure 1:
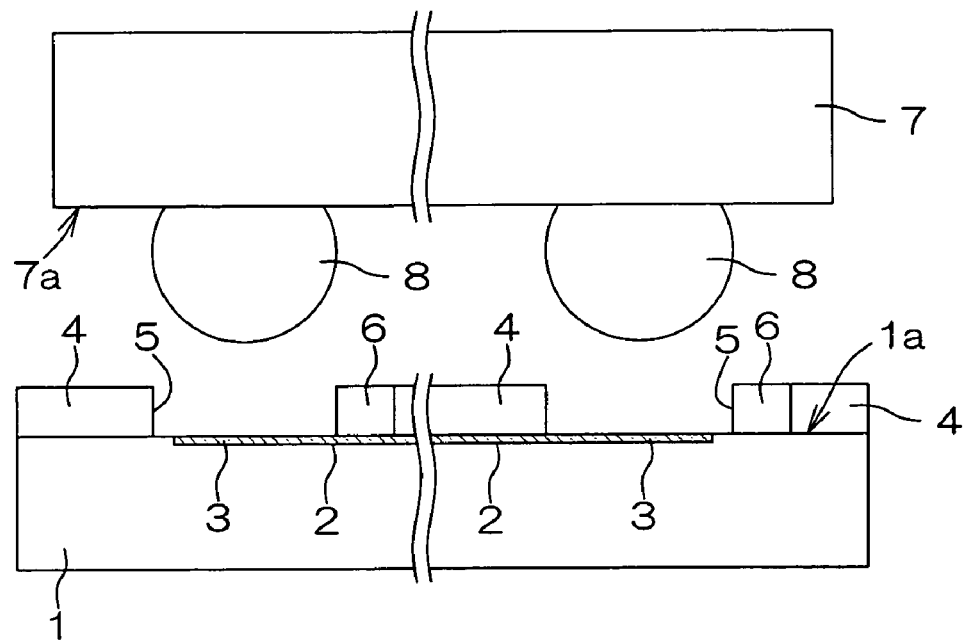
FIG. 1 is a schematic sectional view showing the structure of a packaging substrate according to an embodiment of the present invention and a semiconductor chip to be bonded to the packaging substrate.
Figure 2:
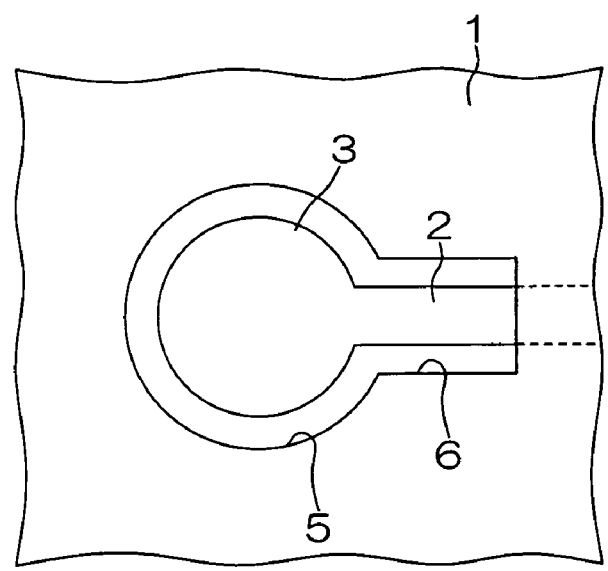
FIG. 2 is a plan view of a main part of the packaging substrate of FIG. 1.

FIG. 1 is a schematic sectional view showing the structure of a packaging substrate according to an embodiment of the present invention and a semiconductor chip to be bonded to the packaging substrate. And FIG. 2 is a plan view of a main part of the packaging substrate of FIG. 1.

The packaging substrate 1 comprises a thin resin substrate formed of a resin material such as a polyimide resin or an epoxy resin. On a surface 1a as a bonding surface of the packaging substrate 1, a copper wiring 2 and a plurality of electrode parts 3 electrically connected to the copper wiring 2 respectively are formed. Each electrode part 3 is formed in a substantially circular shape in plan view. These copper wiring 2 and electrode parts 3 can be formed, for example, by plating.

Provided on the surface 1a of the packaging substrate 1 is a solder resist layer 4 as a wiring protective layer for coating and protecting the copper wiring 2. The solder resist layer 4 is provided with a plurality of electrode openings 5 for separately exposing each electrode part 3 from the solder resist layer 4. Each electrode opening 5 is formed in a circular shape having a slightly larger diameter than that of the electrode part 3 in plan view at a position corresponding to each of the below mentioned plurality of metal balls 8. Further, the solder resist layer 4 is provided with escape openings 6 each of which is formed in a substantially rectangular shape in plan view and in continuation with each electrode opening 5. Each escape opening 6 is extended along the copper wiring 2 electrically connected to the electrode part 3 in each electrode opening 5.

To a semiconductor chip 7, for example, a WL-CSP (Wafer Level-Chip Scale Package) technology has been applied. A surface 7a of this semiconductor chip 7, on which a function element is formed, is sealed with a protective resin layer. And disposed on the protective resin layer are a plurality of metal balls 8 as connection metal bodies each formed in a ball-like shape of a metal material such as solder. Each metal ball 8 is electrically connected to the function element.

The surface 7a of the semiconductor chip 7 is opposed to the surface 1a of the packaging substrate 1 and positioned in such a manner that the plurality of metal balls 8 can be vertically opposed respectively to the corresponding electrode openings 5 (electrode parts 3), and then, with being heated, the semiconductor chip 7 is pressed against the surface 1a of the packaging substrate 1 by a bonding tool. Thereby, a semiconductor device of a flip chip bonding structure can be obtained in which the metal balls 8 are connected respectively to the corresponding electrode parts 3 and the semiconductor chip 7 is connected to the packaging substrate 1 with a predetermined distance therebetween.

Figure 3:
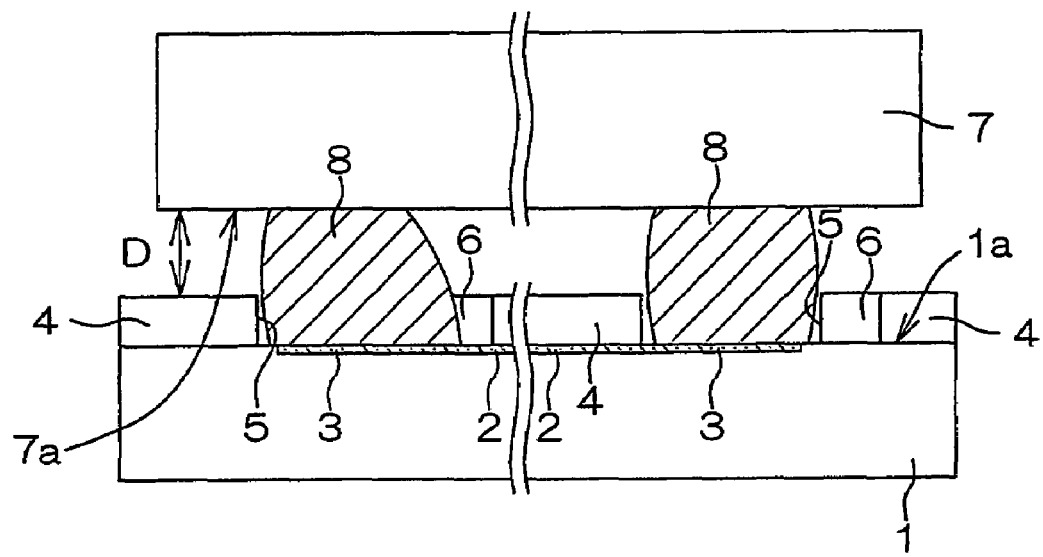
FIG. 3 is a schematic sectional view showing the structure of a semiconductor device obtained by bonding the semiconductor chip to the packaging substrate of FIG. 1.
Figure 4:
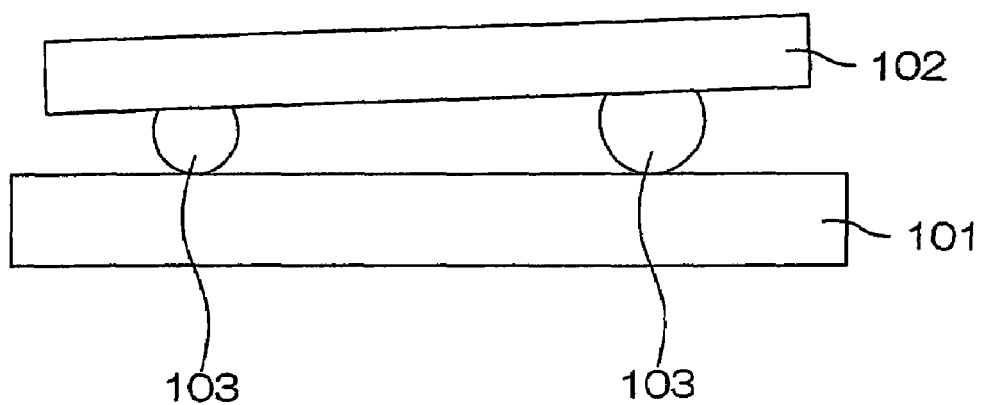
FIG. 4 is a schematic side view showing the structure of a conventional semiconductor device.

Even if the sizes of the metal balls 8 are different from one another, molten solutions of relatively large-sized metal balls flow into the escape openings 6 respectively when the semiconductor chip 7 is, with being heated, pressed against the packaging substrate 1, so that a part of each of the relatively large-sized metal balls 8 can escape into the escape opening 6 as shown in FIG. 3. Therefore, the distance D between the semiconductor chip 7 and the packaging substrate 1 can be uniformalized with the distance corresponding to a relatively small-sized (the smallest-sized) metal ball 8. As a result, a parallel position of the semiconductor chip 7 to the packaging substrate 1 can be ensured, thereby to obtain a semiconductor device in which the semiconductor chip 7 is bonded in a parallel position to the packaging substrate 1.

Further, since the escape opening 6 is formed along the copper wiring 2, the molten solution of the metal ball 8 can be led along the copper wiring 2 into the escape opening 6 when the metal ball 8 is connected to the electrode part 3. Therefore, according to this embodiment, a semiconductor device in which the semiconductor chip 7 is bonded in a parallel position to the packaging substrate 1 can be more surely obtained.

Although the embodiment of the present invention has been described in detail, it is clearly understood that the same is by way of an example only for making apparent the technical contents of the invention, and the invention is not to be interpreted as limited to the example but the spirit and scope of the present invention is limited only by the terms of the appended claims.

In the abovementioned embodiment, a WL-CSP technology has been applied to the semiconductor chip 7, but the semiconductor chip 7 has only to be capable of being bonded to the packaging substrate 1 by a flip chip bonding technology and is not limited to one to which a WL-CSP technology has been applied.

This application corresponds to the Japanese Patent Application No. 2004-291731 filed in the Japan Patent Office on Oct. 4, 2004, and the whole disclosure of the Japanese application is incorporated in this application by citation.

What is claimed is:

1. A packaging substrate to which a semiconductor chip having a plurality of connection metal bodies on a surface thereof is bonded with the surface opposed to the packaging substrate, comprising:

a wiring provided on a bonding surface to which the semiconductor chip is bonded, a plurality of electrode parts provided on the bonding surface and electrically connected to the wiring, a wiring protective layer for coating and protecting the wiring, electrode openings formed by partly opening the wiring protective layer for separately exposing each of the electrode parts from the wiring protective layer, and escape openings, each being formed in continuation with a respective electrode opening in the wiring protective layer and exposing a part of the wiring, each escape opening having a width greater than a width of the wiring and exposing an entire width of the part of the wiring, each escape opening introducing onto the exposed part of the wiring a part of the connection metal body that escapes into the escape opening when the connection metal body is connected to each of the electrode parts.

2. The packaging substrate according to claim 1, wherein the escape opening is formed along the wiring extending from the electrode opening formed in continuation with the escape opening.

3. A semiconductor device, comprising:

a packaging substrate and a semiconductor chip which has a plurality of connection metal bodies on a surface thereof and is bonded to the packaging substrate with the surface opposed to the packaging substrate, the packaging substrate comprising:

a wiring provided on the bonding surface to which the semiconductor chip is bonded, a plurality of electrode parts provided on the bonding surface and electrically connected to the wiring, a wiring protective layer for coating and protecting the wiring, electrode openings formed by partly opening the wiring protective layer for separately exposing each of the electrode parts from the wiring protective layer, and escape openings, each being formed in continuation with a respective electrode opening in the wiring protective layer and exposing a part of the wiring, each escape opening having a width greater than a width of the wiring and exposing an entire width of the part of the wiring, each escape opening introducing onto the exposed part of the wiring a part of the connection metal body that escapes into the escape opening when the connection metal body is connected to each of the electrode parts.

4. The semiconductor device according to claim 3, wherein the escape opening is formed along the wiring extending from the electrode opening formed in continuation with the escape opening.

5. The semiconductor device according to claim 3, wherein:

the plurality of connection metal bodies includes a first metal body and a second metal body larger than the first metal body, the electrode parts include a first electrode part and a second electrode part, the electrode openings include a first electrode opening exposing the first electrode part and a second electrode opening exposing the second electrode part, the escape opening include a first escape opening formed in continuation with the first electrode opening, and a second escape opening formed in continuation with the second electrode opening, when the first and second metal bodies are respectively connected to the first and second electrode parts, the second metal body is pressed against the packaging substrate, and when the second electrode opening is not spacious enough to accommodate all parts of the pressed second metal body, a portion of the second metal body escapes into the second escape opening, so that the semiconductor chip is bonded in a parallel position to the packaging substrate.

6. The semiconductor device according to claim 1, wherein:

the plurality of connection metal bodies includes a first metal body and a second metal body larger than the first metal body, the electrode parts include a first electrode part and a second electrode part, the electrode openings include a first electrode opening exposing the first electrode part and a second electrode opening exposing the second electrode part, the escape opening include a first escape opening formed in continuation with the first electrode opening, and a second escape opening formed in continuation with the second electrode opening, when the first and second metal bodies are respectively connected to the first and second electrode parts, the second metal body is pressed against the packaging substrate, and when the second electrode opening is not spacious enough to accommodate all parts of the pressed second metal body, a portion of the second metal body escapes into the second escape opening, so that the semiconductor chip is bonded in a parallel position to the packaging substrate.

* * * * *